US010727811B2

(12) United States Patent
Shealy et al.

(10) Patent No.: US 10,727,811 B2
(45) Date of Patent: Jul. 28, 2020

(54) EFFECTIVE COUPLING COEFFICIENTS FOR STRAINED SINGLE CRYSTAL EPITAXIAL FILM BULK ACOUSTIC RESONATORS

(71) Applicant: Akoustis, Inc., Huntersville, NC (US)

(72) Inventors: Jeffrey B. Shealy, Cornelius, NC (US); Shawn R. Gibb, Huntersville, NC (US)

(73) Assignee: Akoustis, Inc., Huntersville, NC (US)

( * ) Notice: Subject to any disclaimer, the term of this patent is extended or adjusted under 35 U.S.C. 154(b) by 49 days.

(21) Appl. No.: 15/996,358

(22) Filed: Jun. 1, 2018

(65) Prior Publication Data
US 2019/0372555 A1    Dec. 5, 2019

(51) Int. Cl.
*H03H 9/70*    (2006.01)
*H03H 9/02*    (2006.01)
(Continued)

(52) U.S. Cl.
CPC .............. *H03H 9/706* (2013.01); *H03H 3/02* (2013.01); *H03H 3/04* (2013.01);
(Continued)

(58) Field of Classification Search
CPC ...... H03H 9/706; H03H 9/02157; H03H 3/04; H03H 2009/02204; H03H 2003/0435;
(Continued)

(56) References Cited

U.S. PATENT DOCUMENTS 6,407,649 B1 * 6/2002 Tikka ................... H03H 9/0571
29/25.35
6,441,703 B1 * 8/2002 Panasik ................. H03H 9/589
29/25.35
(Continued)

FOREIGN PATENT DOCUMENTS

JP    2010068109 A    3/2010

OTHER PUBLICATIONS

Search Report and Written Opinion dated Sep. 26, 2019 for PCT Application No. PCT/US2019/032857.

*Primary Examiner* — Robert J Pascal
*Assistant Examiner* — Jorge L Salazar, Jr.
(74) *Attorney, Agent, or Firm* — Richard T. Ogawa; Ogawa P.C.

(57) ABSTRACT

In an array of single crystal acoustic resonators, the effective coupling coefficient of first and second strained single crystal filters are individually tailored in order to achieve desired frequency responses. In a duplexer embodiment, the effective coupling coefficient of a transmit band-pass filter is lower than the effective coupling coefficient of a receive band-pass filter of the same duplexer. The coefficients can be tailored by varying the ratio of the thickness of a piezoelectric layer to the total thickness of electrode layers or by forming a capacitor in parallel with an acoustic resonator within the filter for which the effective coupling coefficient is to be degraded. Further, a strained piezoelectric layer can be formed overlying a nucleation layer characterized by nucleation growth parameters, which can be configured to modulate a strain condition in the strained piezoelectric layer to adjust piezoelectric properties for improved performance in specific applications.

20 Claims, 13 Drawing Sheets

(51) Int. Cl.
*H03H 3/02* (2006.01)
*H03H 3/04* (2006.01)

(52) U.S. Cl.
CPC .... *H03H 9/02086* (2013.01); *H03H 9/02157* (2013.01); *H03H 2003/0428* (2013.01); *H03H 2003/0435* (2013.01); *H03H 2003/0471* (2013.01); *H03H 2009/02204* (2013.01)

(58) Field of Classification Search
CPC ... H03H 2003/0428; H03H 2003/0471; H03H 9/02086; H03H 3/02; H03H 9/542; H03H 9/02015; H03H 9/021; H03H 2003/025; H03H 2003/0442
USPC .......................................... 333/133, 187, 188
See application file for complete search history.

(56) References Cited

U.S. PATENT DOCUMENTS

| | | | |
|---|---|---|---|
| 6,472,954 B1 | 10/2002 | Ruby et al. | |
| 7,106,148 B2* | 9/2006 | Kawamura | H03H 9/564 |
| | | | 333/133 |
| 2007/0228876 A1* | 10/2007 | Sung | H03H 3/04 |
| | | | 310/320 |
| 2007/0252662 A1 | 11/2007 | Nishihara et al. | |
| 2007/0296523 A1* | 12/2007 | Yamakawa | H03H 3/04 |
| | | | 333/133 |
| 2009/0033177 A1 | 2/2009 | Itaya et al. | |
| 2017/0077386 A1 | 3/2017 | Shealy | |
| 2018/0062617 A1 | 3/2018 | Yun et al. | |

\* cited by examiner

EFFECTIVE COUPLING COEFFICIENTS FOR STRAINED SINGLE CRYSTAL EPITAXIAL FILM BULK ACOUSTIC RESONATORS

CROSS-REFERENCES TO RELATED APPLICATIONS

N/A

BACKGROUND OF THE INVENTION

The present invention relates generally to acoustic resonators and more particularly to controlling the effective coupling coefficient of a single crystal epitaxial film bulk acoustic resonator.

In many different communications applications, a common signal path is coupled to both an input of a receiver and an output of a transmitter. For example, in a cellular or cordless telephone, an antenna may be coupled to the receiver and the transmitter. In such an arrangement, a duplexer is often used to couple the common signal path to the input and the output. The function of the duplexer is to provide the necessary coupling to and from the common signal path, while preventing the signals generated by the transmitter from being coupled to the input of the receiver.

One type of duplexer is referred to as the half duplexer. A half duplexer uses a switch to connect the common signal path to the receiver or the transmitter on a time division basis. The half duplexer has the desired coupling and attenuation properties, but is unacceptable in many telephony applications, since it does not allow parties of a call to speak and be heard simultaneously.

A type of duplexer that is more acceptable for telephony applications is the full duplexer. A full duplexer operates only if the transmit signal has a frequency that is different than the frequency of the receive signal. The full duplexer incorporates band-pass filters that isolate the transmit signal from the receive signal according to the frequencies. FIG. 1 illustrates a conventional circuit used in cellular telephones, personal communication system (PCS) devices and other transmit/receive devices. A power amplifier 10 of a transmitter is connected to a transmit port 12 of a full duplexer 14. The duplexer also includes a receive port 16 that is connected to a low noise amplifier (LNA) 18 of a receiver. In addition to the transmit port and the receive port, the duplexer 14 includes an antenna port 20, which is connected to an antenna 22.

The duplexer 14 is a three-port device having the transmit port 12, the receive port 16 and the antenna port 20. Internally, the duplexer includes a transmit band-pass filter 24, a receiver band-pass filter 26 and a phase shifter 28. The passbands of the two filters 24 and 26 are respectively centered on the frequency range of the transmit signal that is input via the power amplifier 10 and the receive signal to which the receiver is tuned.

The requirements for the band-pass filters 24 and 26 of the duplexer 14 are stringent. The band-pass filters must isolate low intensity receive signals generated at the antenna 22 and directed to the input of the low noise amplifier 18 from the strong transmit signals generated by the power amplifier 10. In a typical embodiment, the sensitivity of the low noise amplifier may be in the order of −100 dBm, while the power amplifier may provide transmit signals having an intensity of approximately 28 dBm. It is expected that the duplexer 14 must attenuate the transmit signal by approximately 50 dB between the antenna port 20 and the receive port 16 to prevent any residual transmit signal mixed with the receive signal at the receive port from overloading the low noise amplifier.

One type of PCS that is used in a mobile telephone employs code division multiple access (CDMA). The CDMA PCS wireless bands are centered at approximately 1920 MHz and have an especially stringent regulatory requirement for duplexer performance. Some concerns will be identified with reference to FIG. 2. A passband 30 is defined by several poles and several zeros. The poles and zeros are equidistantly spaced from a center frequency 32. For the transmitter passband 30, the transmitter-to-antenna insertion loss 34 is preferably better than −3 dB over most of the band. The isolation from the transmitter to receiver ports exceeds 50 dB across most of the transmitter band and 46 dB in the receiver band. The crossover between the transmitter and receiver bands occurs around 1920 MHz. The transmitter and receiver bands are approximately 3.0 percent of the carrier frequency, so that extremely sharp filter roll-off 36 and 38 is required. As will be explained more fully below, the lower-frequency poles and zeroes and the roll-off 36 are determined by the characteristics of shunt resonators, while the higher-frequency poles and zeroes and the roll-off 38 are determined by the characteristics of series resonators.

Another challenge for the duplexer is achieving power handling requirements. The power amplifier 10 of FIG. 1 in the transmitter can deliver 1 Watt of power to the transmit port 12 of the duplexer 14. The band-pass filter 24 must be capable of handling such power without being destroyed and without its performance being degraded.

The duplexer 14 will be described in greater detail with reference to FIG. 3. The duplexer includes a transmit film bulk acoustic resonator (FBAR) array 40 and a receive FBAR array 42. The transmit FBAR array is a two-stage ladder circuit having two series FBARs 44 and 46 and two shunt FBARs 50 and 52. The series FBARs are connected in series between the transmit port 12 and the antenna port 20, while the shunt FBARs are connected between electrical ground and nodes between the series FBARs. Each full stage of an FBAR array is composed of one series FBAR and one shunt FBAR. In order to handle the high power generated by the power amplifier at the filter input of the transmit filter, power bars are used for each of the series elements 44 and 46.

The receive FBAR array is a 3½-stage ladder circuit. A half stage is limited to either one series FBAR or one shunt FBAR. In the exemplary array 42, the half stage is a shunt FBAR 60. The FBAR array includes three series FBARs 54, 56 and 58 and four shunt FBARs 60, 62, 64 and 66. The series FBARs are connected in series between the ninety degree phase shifter 28 and the receive port 16. The shunt FBARs are connected between electrical ground and nodes between the series FBARs.

Circuits suitable for use as the ninety degree phase shifter 28 are known in the art. As examples, the phase shifter may be composed of inductors and capacitors or may be a .lambda./4 transmission line.

Within the transmit FBAR array 40, each series FBAR 44 and 46 may have the same resonant frequency (f.sub.r-.sup.Tx), which may be centered at 1880 MHz. Similarly, the shunt FBARs 50 and 52 may have the same resonant frequency, but the resonant frequency of the series FBARs is approximately 1.0 percent to 3.0 percent (typically 1.6 percent) greater than that of the shunt FBARs. As a result, the poles that were described with reference to FIG. 2 are provided.

The receive FBAR array 42 of the receive band-pass filter 26 may also be composed of series FBARs 54, 56 and 58 having the same $f_r^{Rx}$ and shunt FBARs 60, 62, 64 and 66 having the same resonant frequency that is 3.0 percent different than the resonant frequency $f_r^{Rx}$ of the series FBARs. Here, $f_r^{Rz}$ is centered at 1960 MHz.

Other considerations that affect the shape of the response shown in FIG. 2 are the figure of merit, which is referred to as Q, and the effective coupling coefficient, which is also referred to as $kt^2$. The effective coupling coefficient may be considered as being the ratio of electrical energy to acoustic energy in the operation of a particular FBAR. It has been the goal to maximize both Q and the effective coupling coefficient. As a result of the fabrication process, the effective coupling coefficient can be as high as 8.0 percent. It has been experimentally determined that Q is dependent upon $kt^2$ and, in some cases, that it is better to decrease $kt^2$ in order to significantly increase Q. The Q determines the roll-off of the response.

In addition the considerations discussed above, acoustic resonators.

What is needed is a fabrication method and a resulting duplexer which provide a very steep roll-off in the operation of an array of acoustic resonators further improved with single crystal piezoelectric materials.

BRIEF SUMMARY OF THE INVENTION

The present invention relates generally to acoustic resonators and more particularly to controlling the effective coupling coefficient of a single crystal epitaxial acoustic resonator.

The performance of arrays of acoustic resonators is enhanced by using single crystal piezoelectric materials and tailoring the effective coupling coefficients of the individual acoustic resonators on the basis of the functions of the resonators. In a duplexer embodiment, the effective coupling coefficients of FBARs in a transmit band-pass filter are fabricated to have a lower effective coupling coefficient than the FBARs of the receive band-pass filter of the same duplexer.

In one embodiment, the difference in the effective coupling coefficients is achieved by varying the thicknesses of the electrode layers. For a given frequency, the effective coupling coefficient of an acoustic resonator is modified by varying the ratio of the thickness of the piezoelectric layer to the total thickness of the electrode layers. Typically, a goal in the fabrication of FBARs is to minimize the thickness of the electrode layers, thereby providing an "intrinsic" effective coupling coefficient. For example, this intrinsic coefficient may be in the range of 7.0 percent to 8.0 percent. However, the coupling coefficient of an FBAR filter having a given resonant frequency can be adjusted downwardly by decreasing the ratio of the thickness of the piezoelectric layer to the total thickness of the electrode layers, since the resonant frequency is dependent upon the "weighted thickness" (i.e., the physical thickness weighted on the basis of the selection of electrode and piezoelectric materials) of the electrode-piezoelectric stack. As one example of a transmit filter, the thickness of molybdenum (Mo) electrodes can be increased and the thickness of aluminum nitride (AlN) can be reduced in order to achieve a degraded effective coupling coefficient in the range of 2.5 percent to 4.0 percent, while maintaining a targeted resonant frequency. Similarly, a receive filter can be fabricated to have an effective coupling coefficient in the range of 4.0 percent to 6.0 percent by selecting the appropriate thicknesses for the layers that form the FBARs of the receive filter.

The method of fabricating an array of acoustic resonators in accordance with this embodiment includes a step of selecting a first target frequency range and a first target effective coupling coefficient for operation of an FBAR transmit (Tx) filter, and includes selecting a second target frequency and a second target coupling coefficient for operation of an FBAR receiver (Rx) filter. The thicknesses and materials of the piezoelectric and electrode layers for forming the two FBAR filters are determined on the basis of achieving the target resonant frequencies and the target effective coupling coefficients. The determinations include selecting an increased electrode layer thickness for at least one electrode of the Tx FBARs, so that the Tx FBAR filter will have the degraded coefficient. The two filters are then formed according to the selected thicknesses and materials.

In the fabrication of the two filters, the electrode material may be Mo and the piezoelectric material may be AlN. Using these materials, the electrode layers of the FBAR Tx filter having the degraded coupling coefficient will have a thickness that can be in the range of 1.2 to 2.8 times the thickness of the electrode layers of the Rx filter with the higher coefficient. For example, in a communications device that is compatible with the CDMA PCS standard, the Rx filter may have electrode layer thicknesses of 2200 Å and a piezoelectric thickness of 2.2 microns in order to achieve a coupling coefficient in the range of 5.6 percent to 5.8 percent, while the Tx filter may have electrode layer thicknesses of 4500 Å and a piezoelectric thickness of roughly 8000 Å in order to achieve a coupling coefficient in the range of 3.1 percent to 3.2 percent. The Q (and therefore the steepness of the roll-off) is almost two times higher for the Tx filter than for the Rx filter.

In one application, a desired filter arrangement of FBARs is designed to include at least one "power bar" in order to increase the power handling capacity along a path of the filter arrangement. A "power bar" is defined herein as a pair of large area FBARs which are connected in series in place of a single target FBAR. Each large area FBAR occupies an area that is twice the area of the target FBAR. The parallel-series combination defined by the power bar (in the series connection of conventional electrical equivalent circuits) allows the impedance of the power bar to remain at the target impedance of the target FBAR, but reduces the power density by a factor of four.

In a second embodiment of the invention, the degraded effective coupling coefficient is achieved by forming a capacitor in parallel with at least some of the resonators of the Tx filter. Preferably, the capacitor is formed using materials that are deposited in steps for fabricating the array of acoustic resonators. For example, the electrodes and the piezoelectric layer that are deposited to fabricate the FBARs may be utilized in the formation of a capacitor that is placed in parallel with at least one FBAR of the Tx filter to degrade the effective coupling coefficient. However, the concern in using these layers is that a resonator will be fabricated, rather than a capacitor. One method for ensuring that the additional component functions as a capacitor is to fabricate the electrode-piezoelectric stack of the component directly on the substrate, rather than suspending the stack. In this manner, the substrate provides the means for mass loading the capacitor, thereby pulling the frequency off center.

A second method is to use the gold layer, which is conventionally used to provide contact pads, as the means to pull the resonator component off frequency. This second method is preferred, since the first method may form a high loss capacitor, while the second method is the one that will form a high Q component. By utilizing the gold layer and by suspending the capacitor component as a free-standing membrane in the same manner as the FBARs, the capacitor functions as a high Q resonator, but at a much lower frequency than the first and second FBARs. An advantage is that the frequency of the capacitor can be "tuned" to not only be displaced from the frequency of interest, but to form a parasitic resonance at frequencies where the duplexer does not perform well. As one example, the capacitor may resonate at 1510 MHz, which is a frequency at which existing duplexers do not perform well in the rejection of energy. Tuning the capacitor to 1510 MHz allows a designer to incorporate specific shunt and series type resonators that reduce leakage of the 1510 MHz signal. This is achieved without any additional process steps to the FBAR fabrication. The tuning of the capacitor can be provided merely by properly selecting the thickness of the gold and other layers in the electrode-piezoelectric stack of the capacitor.

An advantage of the methods described above is that the performance of an array of acoustic resonators is enhanced without significantly affecting the fabrication process. By tailoring the effective coupling coefficients of individual resonators within a full duplexer, roll-off at the opposite edges of the passband can be tailored. Further, the present method produces a reliable single crystal based acoustic filter or resonator using multiple ways of three-dimensional stacking through a wafer process.

A greater understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

The present invention relates generally to acoustic resonators and more particularly to controlling the effective coupling coefficient of a single crystal epitaxial acoustic resonator.

Figure 4:
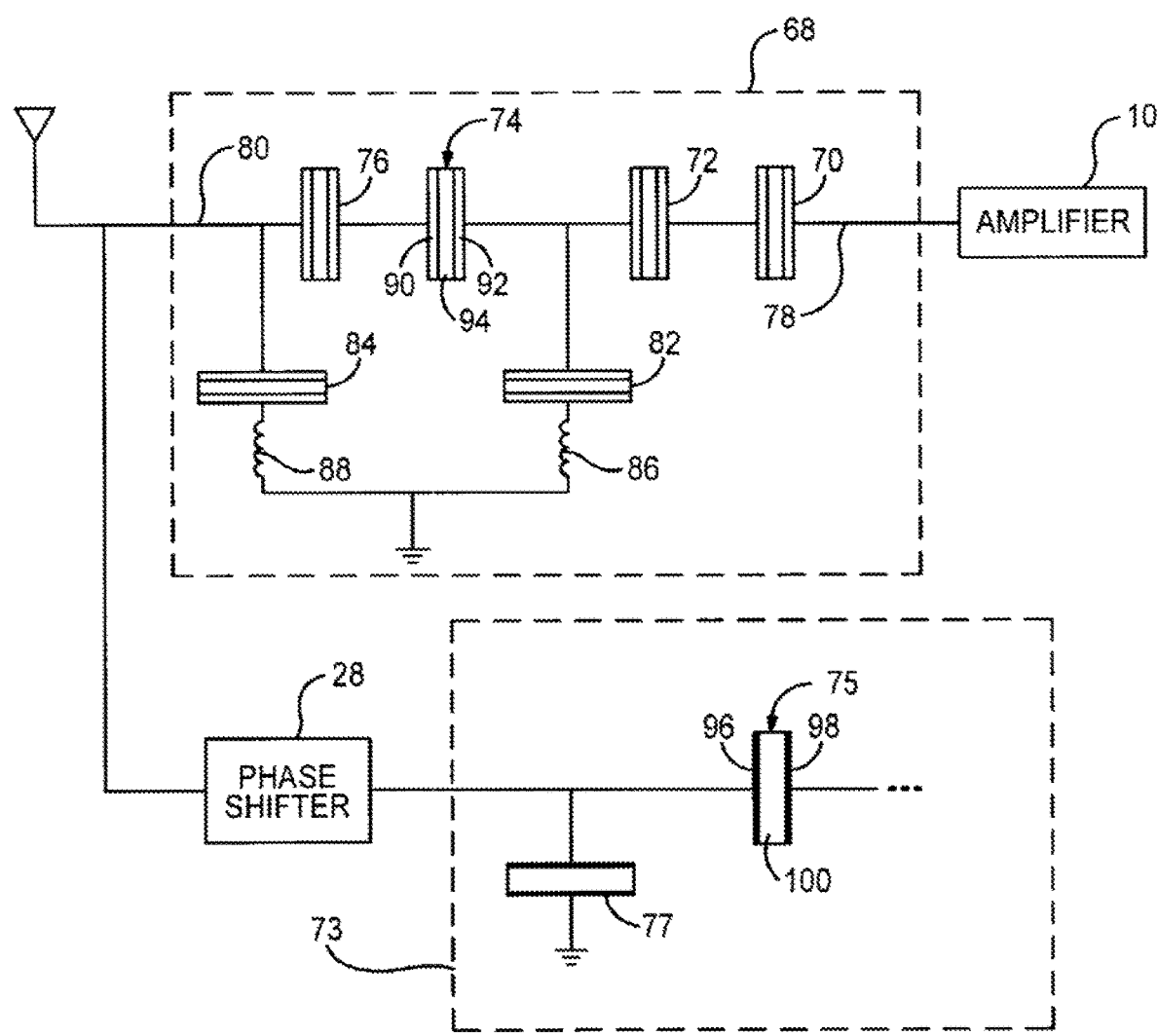
FIG. 4 is a schematic block diagram of an example of a pair of passband filters in which the filters have significantly different effective coupling coefficients in accordance with one embodiment of the invention.

With reference to FIG. 4, a transmit band-pass filter 68 is shown schematically as including four series FBARs 70, 72, 74 and 76 connected in electrical series from a transmit port 78 to an antenna port 80. The filter also includes two shunt FBARs 82 and 84. The first shunt FBAR 82 is connected between the two pairs of series FBARs, while the second shunt FBAR 84 is connected between the antenna port and the series FBAR 76. FIG. 4 also shows one stage of a receive filter 73. This stage includes a series FBAR 75 and a shunt FBAR 77. The number of stages in a transmit (Tx) filter or a receive (Rx) filter is not critical to the invention that will be described more fully below. The significance of the filters is that at least one FBAR will have an effective coupling coefficient that is intentionally degraded relative to at least one other FBAR. In the preferred embodiment, the FBARs of the Tx filter have effective coupling coefficients that are intentionally degraded, while the FBARs of the Rx filter have significantly higher coefficients.

The FBAR pair 70 and 72 and the FBAR pair 74 and 76 are "power bars." The series connection of the two FBARs in each pair increases the power density by a factor of four relative to a single target FBAR. Regarding the first pair of FBARs 70 and 72, each FBAR is fabricated to occupy an area that is twice the area of the target FBAR. When the two FBARs are connected in series, the series-parallel arrangement of resistances and capacitances in the resulting series combination of the conventional electrical equivalent circuits (which will be described below with reference to FIG. 7) will achieve the impedance of the target FBAR, but with the increased power density. The resonant frequencies of the FBARs in a power bar should be the same as the resonant frequency of the target FBAR which is "replaced" by the power bar.

Figure 1:
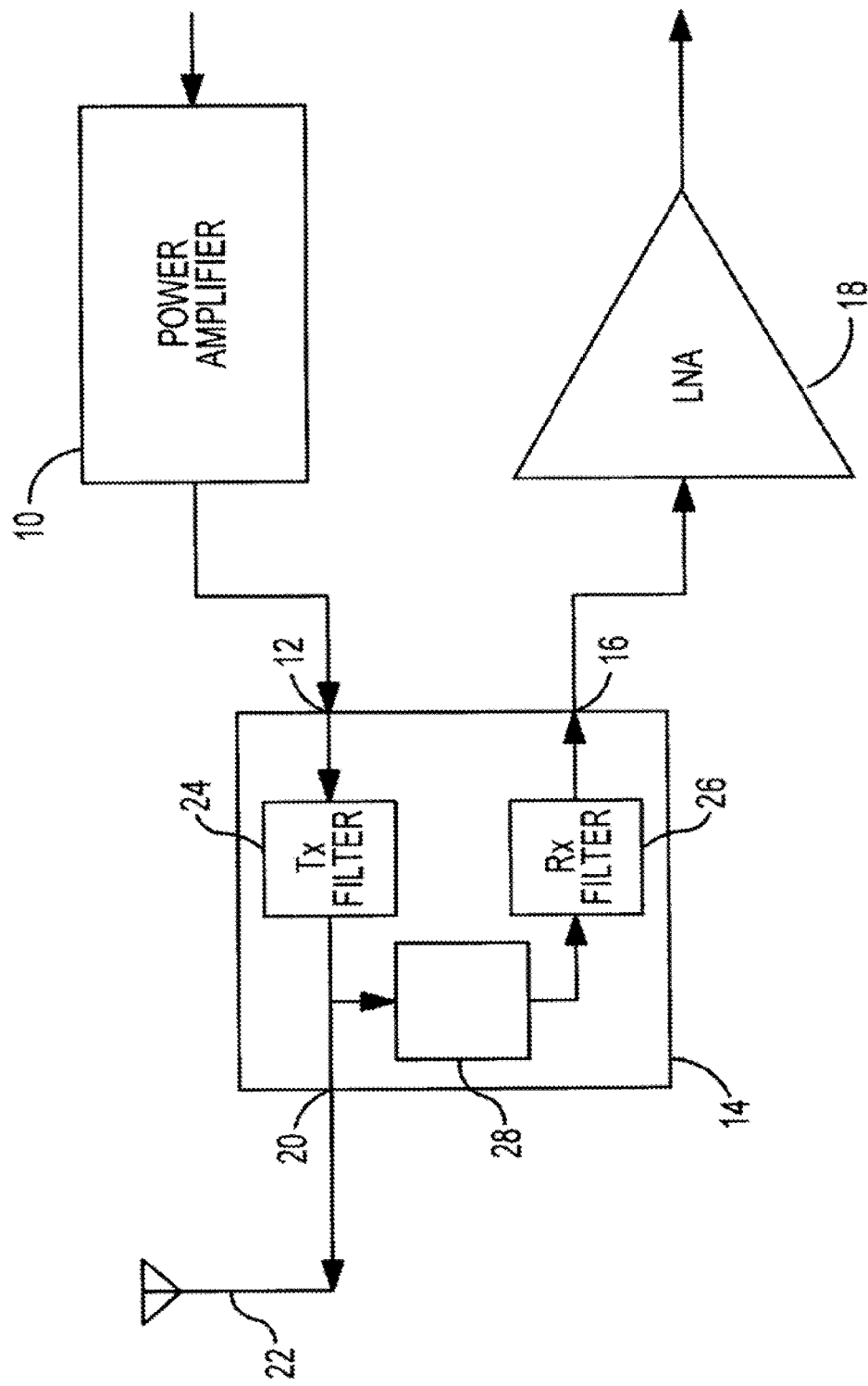
FIG. 1 a block diagram of a front-end circuit of a conventional cellular telephone or similar device.

The phase shifter 28 of FIG. 4 is not critical to the invention and is consistent with the description of the phase shifter 28 of FIG. 1. As two examples, the phase shifter may be comprised of inductors and capacitors or may be a one-quarter wavelength transmission line. Each of the shunt FBARs 82 and 84 is coupled to ground through an external inductor 86 and 88. The inductors may be used to position the attenuation poles of the shunt bars, so that the passband response exhibits the desired characteristics, such as steep roll-off at the outside edges of the response.

Each of the FBARs 70, 72, 74, 75, 76 and 77 includes outside electrode layers and an interior piezoelectric layer. For example, the series FBAR 74 of the Tx filter 68 includes electrodes 90 and 92 that sandwich a piezoelectric layer 94.

Similarly, the series FBAR 75 of the Rx filter 73 includes electrodes 96 and 98 and a center piezoelectric layer 100. The ratio of the thickness of the piezoelectric layer 94 to the total thickness of the electrode layers that sandwich the piezoelectric layer is represented as being much less for the series FBARs of the Tx filter than for the series FBAR of the Rx filter. As will be explained more fully below, the increased electrode layer thickness degrades the coupling coefficient of the Tx filter 68 relative to the Rx filter 73. As a result, the Q of the Tx filter is greater than the Q of the Rx filter and the steepness at the edges of the passband response of the Tx filter is greater than that of the Rx filter.

Figure 5:
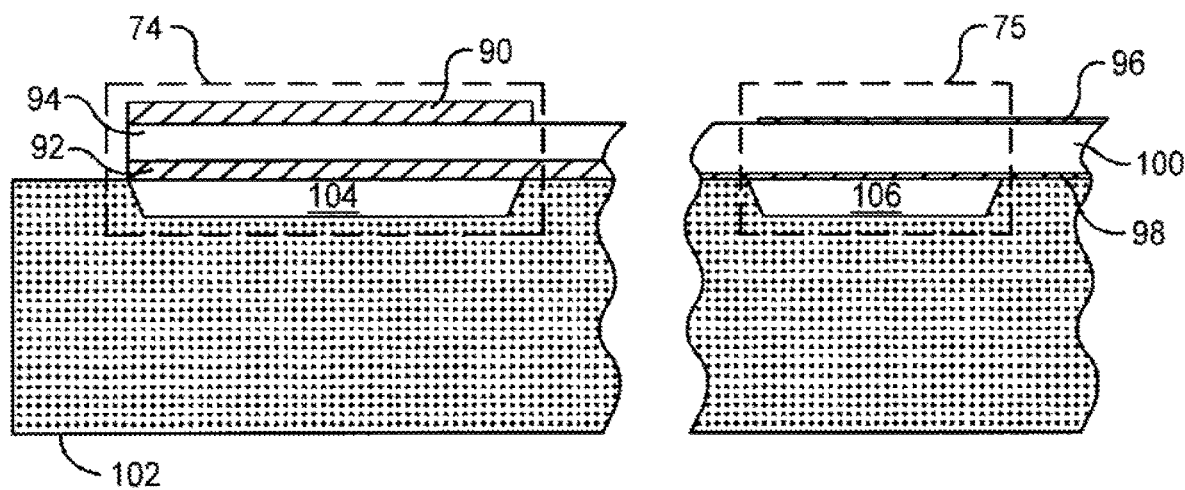
FIG. 5 is a cross sectional view of the selected FBARs of FIG. 4.

FIG. 5 illustrates a side sectional view of the series FBAR 74 of the Tx filter and the series FBAR 75 of the Rx filter. Again, the electrode layers 90 and 92 of the FBAR 74 are shown as being significantly thicker than the electrode layers 96 and 98 of the FBAR 75. Both of the filters 68 and 73 are formed on a single substrate 102, such as a silicon substrate. However, the filters may be formed on separate substrates or may be formed on a material other than silicon. An FBAR is formed where the piezoelectric material 94 and 100 is sandwiched between two electrodes 90, 92, 96 and 98. Preferably, wells 104 and 106 are etched into the substrate below the FBARs. As a result, each electrode-piezoelectric stack that forms an FBAR is a membrane suspended over a well, so as to provide resonator-to-air interfaces at both sides. Alternatively, solidly mounted resonators (SMRs) may be used without diverging from the invention. SMRs typically include acoustic Bragg reflectors at their bottom surfaces in order to provide a large acoustic impedance. A Bragg reflector is made of layers of alternating high and low acoustic impedance materials, with each layer having a thickness of approximately one-quarter wavelength of the resonant frequency of the FBAR. In some applications, a number of FBARs share a single well.

The characteristics of the individual series FBARs 74 and 75 of FIGS. 4 and 5 depend upon the layer thicknesses and the materials of the electrode-piezoelectric stacks. The preferred material for forming the piezoelectric layers 94 and 100 is AlN, but other materials may be utilized (e.g., zinc oxide). An acceptable electrode material is Mo, but other metals may be substituted (e.g., aluminum, tungsten, gold or titanium). For given electrode and piezoelectric materials, characteristics of an FBAR are dependent upon geometrical factors such as the thickness of the piezoelectric layer, the thicknesses of the electrodes and the area of overlap between the electrodes. For example, the resonant frequency is dependent upon the "weighted thickness" of the electrode-piezoelectric stack. The weighted thickness is the physical thickness with an adjustment that is based upon the selection of the electrode and piezoelectric materials. The adjustment is necessary, since the velocity of sound is different in different materials. Changing the weighted thickness of one or both of the electrodes changes the weighted thickness of the electrode-piezoelectric stack, thereby adjusting the resonant frequency of the stack.

Figure 2:
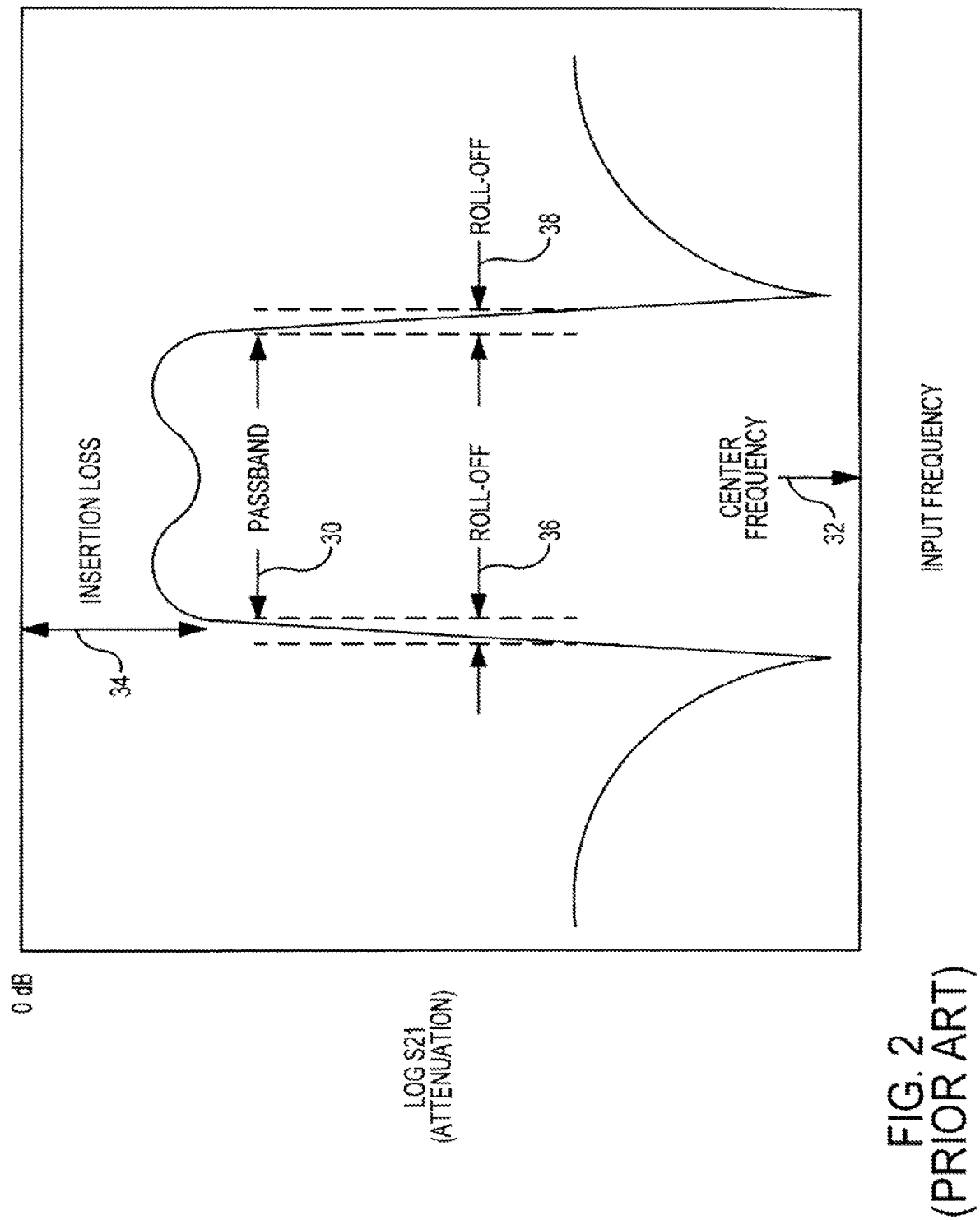
FIG. 2 a graph showing the characteristics of a band-pass filter of the type used in FIG.
Figure 3:
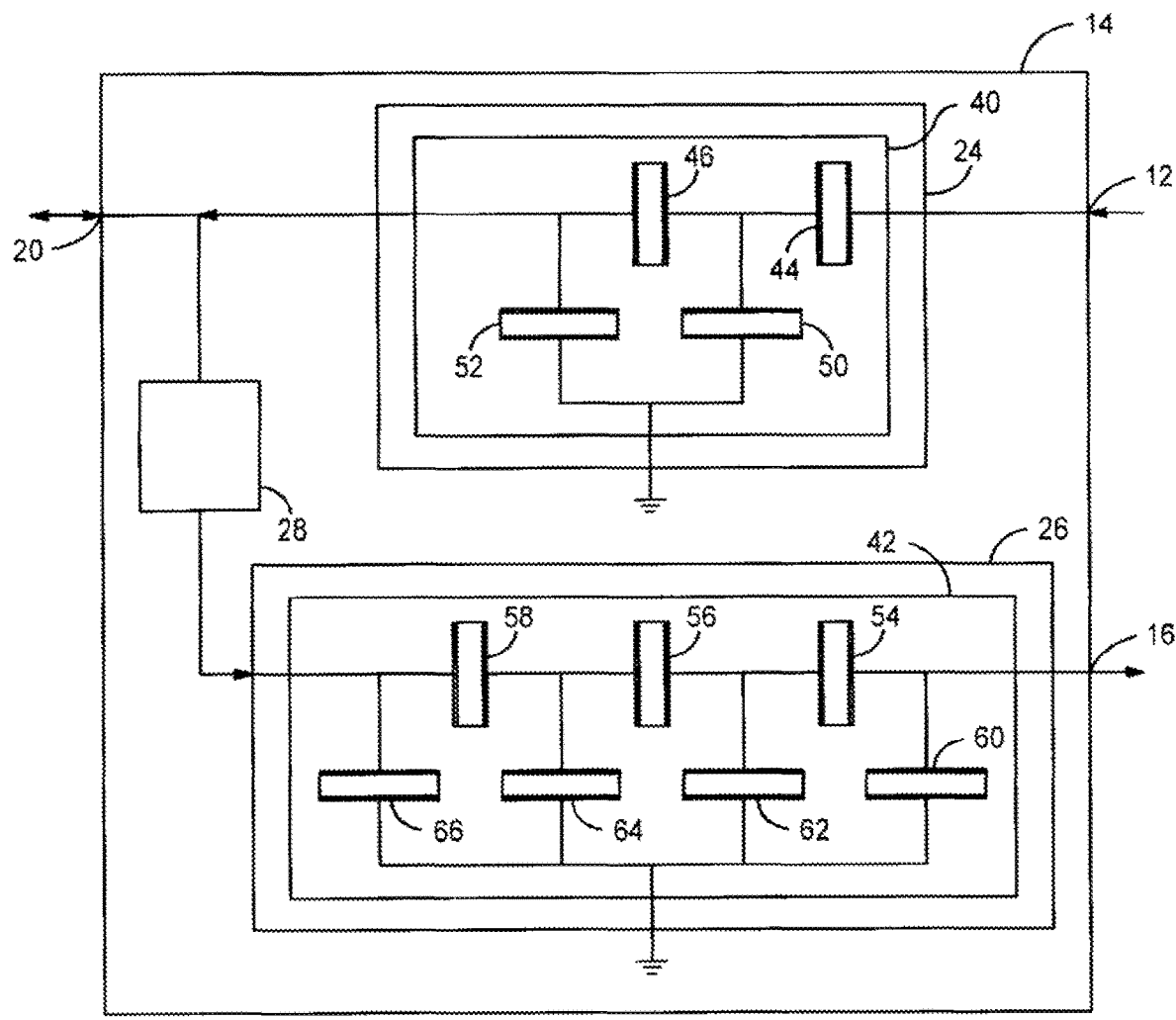
FIG. 3 is a schematic block diagram of a conventional full duplexer.

The layer thicknesses of the electrode-piezoelectric stacks also affect the effective coupling coefficients (kt.sup.2) of the Tx and Rx filters 68 and 73. In accordance with the invention, the effective coupling coefficients of the filters are tailored on the basis of the functions of the filters. By providing the Tx filter 68 with a lower effective coupling coefficient than the Rx filter 73, a CDMA-compatible duplexer exhibits desirable characteristics. As noted with reference to FIGS. 1-3, there is a crossover between the transmitter passband and the receiver passband. The series FBARs 70, 72, 74 and 76 of the Tx filter significantly influence the characteristics of the transmitter passband at the crossover. Intentionally degrading the effective coupling coefficient while maintaining the specification-required resonant frequency enhances the duplexer performance. As previously noted, the reduction in the kt.sup.2 of a Tx filter increases its Q, so that a steeper roll-of is achieved.

In FIG. 5, the cross sectional view through the Tx FBAR 74 and the Rx FBAR 75 shows the difference in the ratios of the thickness of the piezoelectric layer and the total thicknesses of the electrode layers. For the Tx FBAR 74, the ratio is significantly less than that of the Rx FBAR 75. Therefore, the effective coupling coefficient of the Tx filter will be significantly less than the coupling coefficient for the Rx filter. Typically a goal in the fabrication of FBARs is to minimize the thickness of the electrode layers. This provides an intrinsic effective coupling coefficient in the range of 7.0 percent to 8.0 percent. In FIG. 5, the electrode layers 96 and 98 that are used to define the Rx FBAR 75 may be formed of Mo having a thickness of 2200 Å. The portion of the piezoelectric layer 100 that forms the Rx FBAR may be AlN having a thickness of approximately 2.2 microns. This provides the specification-required resonant frequency for the CDMA-compatible transmit filter and provides an effective coupling coefficient in the range of 5.6 percent to 5.8 percent.

The Tx FBAR 74 is formed such that the Tx filter 68 will have the intentionally degraded effective coupling coefficient. The Mo top and bottom electrodes 90 and 92 may have a thickness of approximately 4500 Å, while the thickness of the relevant portion of the piezoelectric layer 94 may be approximately 8000 Å. This provides the specification-required resonant frequency and provides a degraded effective coupling coefficient in the range of 3.1 percent to 3.2 percent.

For Tx and Rx filters 68 and 73 that are formed on the basis of the identified layer thicknesses, the Tx filter may have a Q that is approximately twice that of the Rx filter. Consequently, the steepness at the edges of the Tx filter response will be significantly greater.

Figure 6:
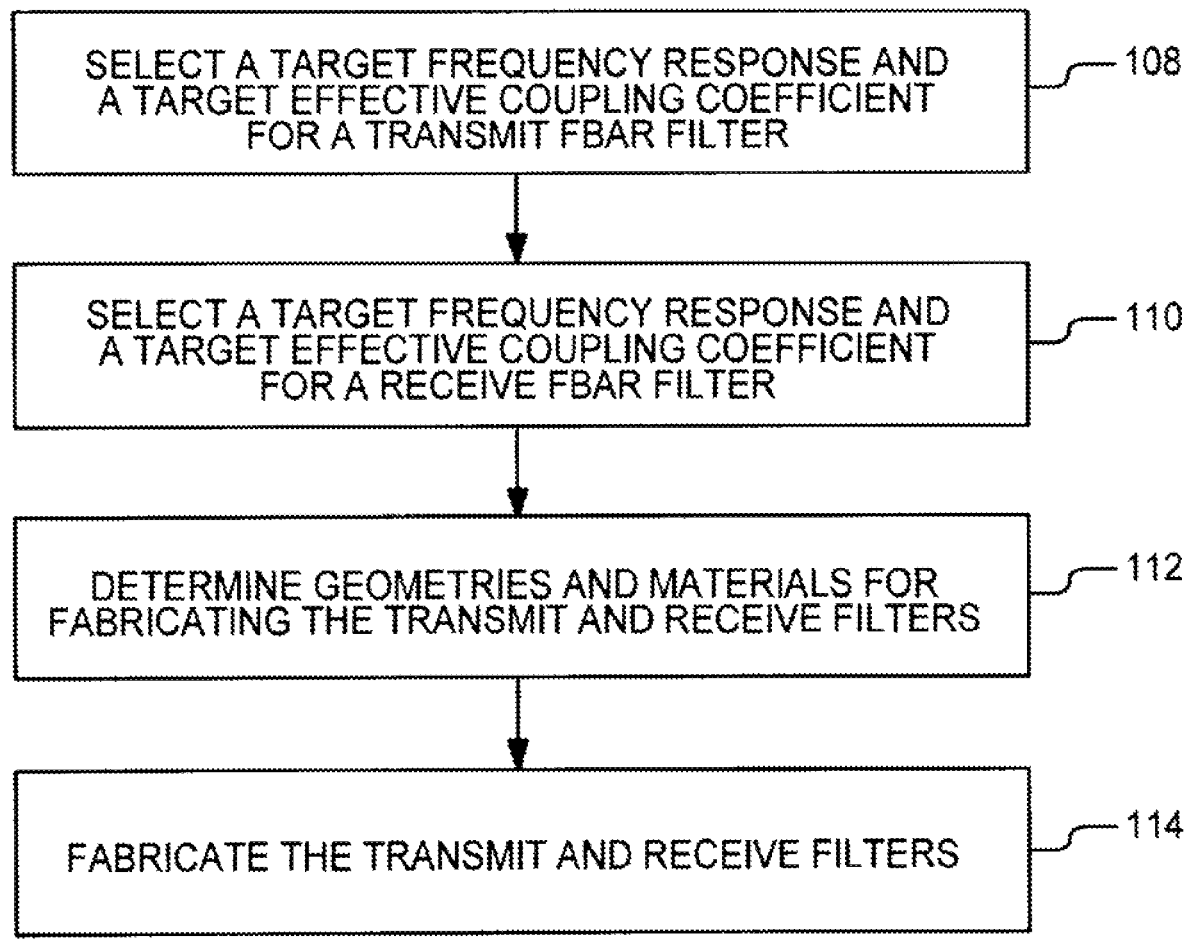
FIG. 6 is a process flow of steps for carrying out the invention described with reference to FIGS. 4 and 5.

Referring now to FIG. 6, the process flow of steps for fabricating coefficient-differentiated FBAR filters in accordance with the invention will be described. In step 108, a target frequency response and a target effective coupling coefficient are selected for a first FBAR filter. In the formation of the transmit filter 68 of FIG. 4, the first FBAR filter is the Tx filter 68. The target frequency response will depend upon the desired application. For example, in a duplexer that is compatible with CDMA requirements, the target frequency response is likely to be centered at 1880 MHz (i.e., $f_r^{Tx}$=1880 MHz).

In step 110, a target frequency response and a target effective coupling efficient are selected for a second FBAR filter. Again referring to FIG. 4, the second FBAR filter is the Rx FBAR filter 73, so that $f_r^{Rx}$=960 MHz. In the preferred embodiment, the first target coupling coefficient is selected to be in the range of 2.5 percent to 4.0 percent, while the second target coupling coefficient is selected to be in the range of 4.0 percent to 6.0 percent.

The layer thicknesses and materials for fabricating the transmit and receive FBAR filters are determined at step 112. This step includes selecting an increased electrode layer thickness for at least one electrode layer of the Tx FBAR filter 68, thereby ensuring that the effective coupling coefficient of the Tx FBAR filter is degraded relative to the coupling coefficient of the Rx FBAR filter 73. This necessitates identifying ratios of the piezoelectric layer thickness to the total thickness of the electrode layers for each of the Tx and Rx FBAR filters. The ratio for the Tx FBAR filter will be less than the identified ratio for the Rx FBAR filter, since the target effective coupling coefficient is reduced for the Tx FBAR filter. For purposes of ease of fabrication, the materials for forming the Tx and Rx FBAR filters are preferably the same. However, this is not critical, since the difference in the coefficients may be partially achieved by selecting different materials for the two filters.

In step 114, the FBARs are fabricated. The filters 68 and 73 may be formed on the same substrate 102, such as shown in FIG. 5. However, there are process advantages to forming the filters on separate substrates and subsequently interconnecting the filters. It is difficult to vary the thicknesses of the electrode layers and the piezoelectric layers on a single substrate. Forming the FBARs on separate substrates eliminates the difficulties. If the FBARs are to be formed on the same substrate, portions of increased layer thickness may be achieved by providing multiple deposition steps. For example, in the formation of the lower electrode layer 92 of FIG. 5, the Mo deposition may be temporarily terminated after the layer has reached its desired thickness for the electrode layer 98. A masking layer may then be deposited in the area of the FBAR 75, so that the re-initiating of the deposition of Mo will occur only in the area of the series FBAR 74. A similar multi-step deposition process may be provided for the piezoelectric layer 100. The two top electrodes 90 and 96 may be similarly formed.

While the first embodiment of the invention has been described as being used in FBARs having a single piezoelectric layer, the invention may be extended to stacked FBARs without diverging from the level of skill in the art. That is, arrays of FBARs having stacked piezoelectric layers that are separated by electrode layers may be fabricated to have tailored effective coupling coefficients, so as to achieve desired filter characteristics.

The process of modifying the ratio of the thickness of the piezoelectric layer to the total thickness of the electrode layers is one means for tailoring the effective coupling coefficients of different FBARs in an FBAR array. A second means of tailoring the effective coupling coefficient is to form capacitors in parallel with selected FBARs. As will be explained more fully below, the parallel connection of a capacitor will degrade the effective coupling coefficient. This use of a capacitor to degrade the effective coupling coefficient may be used in applications other than the design and fabrication of Tx and Rx filters.

Figure 7:
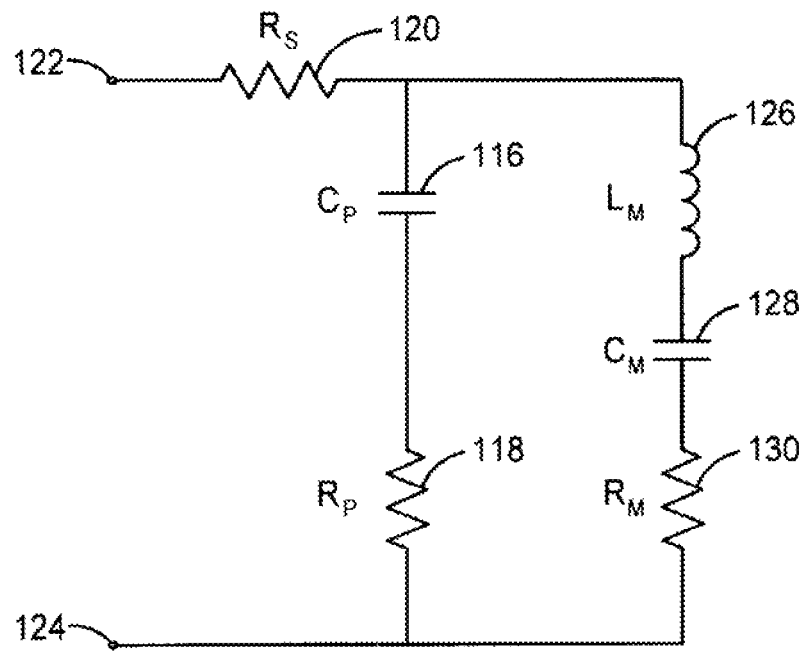
FIG. 7 is a schematic diagram of the conventional electrical equivalent circuit of the FBAR formed in accordance with the first embodiment of the invention.

FIG. 7 is an electrical equivalent circuit for an FBAR. The circuit is known in the art as the modified Butterworth-Van Dyke circuit. The main reactive component is the shunt capacitance ($C_P$) 116, which is the capacitance defined by the structure of the electrodes and the piezoelectric layer. The piezoelectric layer functions as the dielectric for the shunt capacitance 116. The plate resistance ($R_P$) 118 represents the series resistance of the shunt capacitance 116, while the resistance ($R_S$) 120 represents the series electrical resistance of the connections between the contacts 122 and 124 of the electrode-piezoelectric stack. Conventionally, the contacts 122 and 124 are formed of gold.

Figure 8:
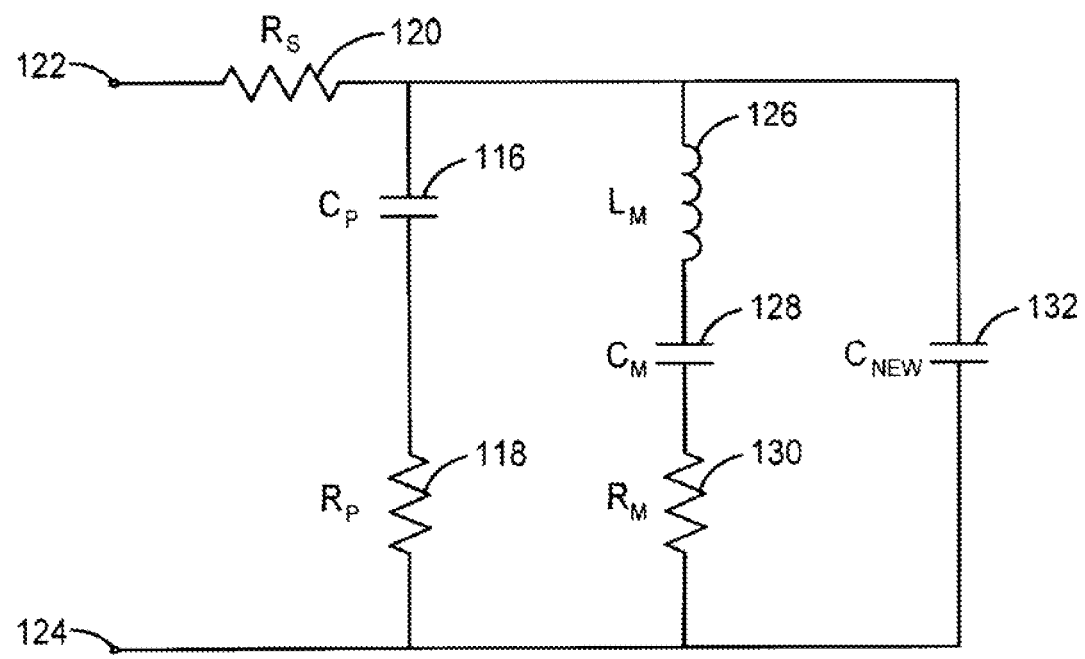
FIG. 8 is a schematic diagram of the electrical equivalent circuit of an FBAR formed in accordance with a second embodiment of the invention.

The series connections of the inductance ($L_M$) 126, capacitance ($C_M$) 128 and resistance ($R_M$) 130 are the motional representations of the resonance due to the piezoelectric properties of the FBAR. In the operation of an FBAR filter having FBARs that are fabricated using the steps described with reference to FIGS. 5 and 6, the effective coupling coefficient is directly related to the ratio of the motional capacitance 128 to the plate capacitance 116. However, by adding a capacitance ($C_{NEW}$) 132 as shown in FIG. 8, the plate capacitance 116 is increased while the motional capacitance 128 remains constant. By placing the capacitance 132 in parallel with each targeted FBAR, the effective coupling coefficient of the FBAR filter is controllably reduced. It should be noted that by adding another resonator of the same frequency in parallel with the FBAR, both of the capacitances 116 and 128 of FIG. 7 are increased, so that the ratio will be unaffected. Clearly, a capacitor rather than a resonator provides the desired effects.

Figure 9:
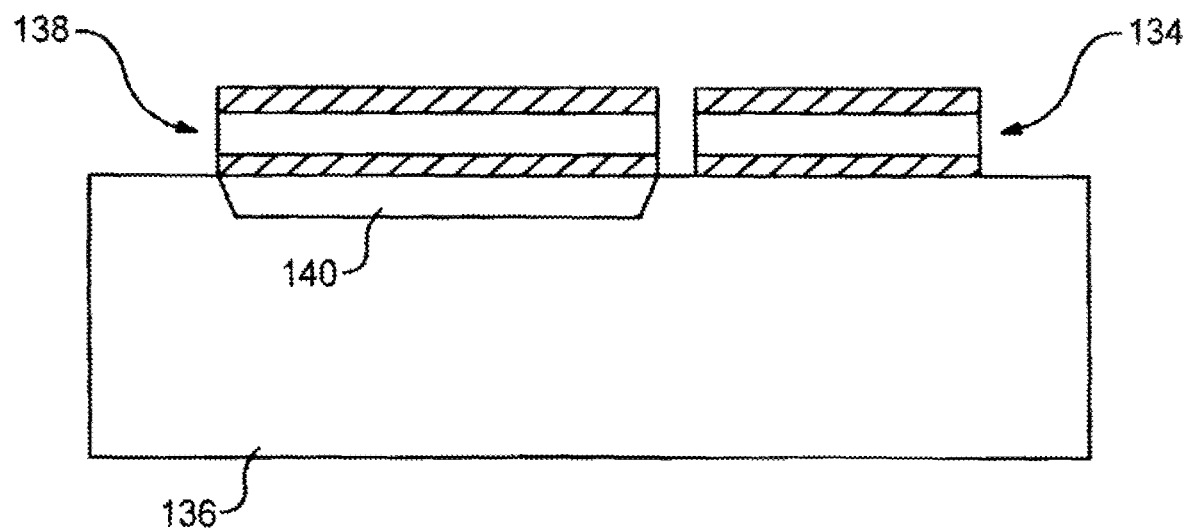
FIG. 9 is a side sectional view of a resonator-capacitor pair, with the capacitor being formed directly on the substrate in accordance with the first approach to the second embodiment represented in FIG. 8.

Preferably, the added capacitance 132 is fabricated using the same materials and techniques as used in the fabrication of the FBAR. The concern with forming a capacitor using the top and bottom electrode layers as plates and the piezoelectric layer as a dielectric is that a resonator will be formed, rather than a capacitor. Thus, the new device should be mass loaded such that it does not resonate at one of the frequencies of interest. Referring to FIG. 9, one technique for mass loading the new device is to fabricate the capacitor stack 134 directly on the surface of the substrate 136. This pulls the resonant frequency off of the center. That is, although the layers of the capacitor stack 134 have the same thicknesses as the layers of the affected FBAR 138, the frequencies will be different because the capacitor stack is formed directly on the surface of the substrate 136, while the FBAR is suspended over the substrate by the formation of a well 140. In order to properly distinguish the capacitor stack 134 from the FBAR stack 138, the connections that provide the electrical parallel arrangement are not shown.

The technique of forming the capacitor stack 134 directly on the surface of the substrate 136 allows the tailoring of the coupling coefficient of the affected FBAR filter, as described with reference to FIG. 8. The concern with this approach is that the capacitor stack may act as a transducer which broadcasts energy into the substrate 136. Since the substrate is relatively thick, a multitude of frequencies can be transmitted. Thus, the new device may be undesirably loosy.

Figure 10:
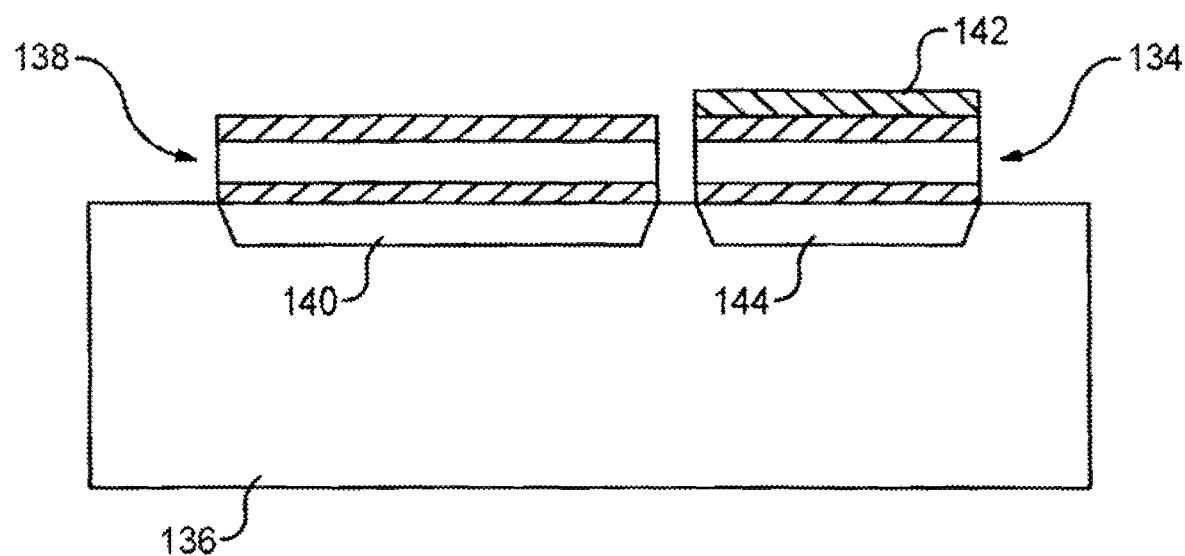
FIG. 10 is a side sectional view of a resonator-capacitor pair, with the capacitor being mass loaded by addition of a top metal layer in accordance with the second approach to achieving the second embodiment represented in FIG. 8.

Referring now to FIG. 10, another approach to forming the capacitance 132 of FIG. 8 is to apply a gold layer 142 to the top of the capacitor stack that is formed over a well 144. The components of FIG. 10 that are identical to those of FIG. 9 are provided with identical reference numerals. Thus, the only differences between the approaches of FIGS. 9 and 10 are the added gold layer 142 and the added well 144. Preferably, the gold layer is the same layer that is conventionally used to form the contact pads for the array of FBARs. The addition of the gold layer reduces the resonant frequency of the stack 134, since it increases the weighted thickness of the top electrode. An advantage to the use of the gold from the pad layer metal level is that the frequency can be "tuned" so that it is not only off of the frequency of interest, but that it forms a parasitic resonance at frequencies where the duplexer does not perform well. As one example, the capacitor may resonate at 1510 MHz, which is a frequency at which existing duplexers do not perform well in the rejection of energy. Tuning the capacitor stack 134 to 1510 MHz allows a designer to incorporate specific shunt resonators and series resonators that reduce leakage of the 1510 MHz signal. This is achieved without adding process steps to the FBAR fabrication. The tuning of the capacitor stack can be achieved merely by properly selecting the thicknesses of the gold and other layers in the stack.

According to an example, the present invention includes a method for forming a piezoelectric layer to fabricate an acoustic resonator device. More specifically, the present method includes forming a single crystal material to be used to fabricate the acoustic resonator device. By modifying the strain state of the III-Nitride (III-N) crystal lattice, the present method can change the piezoelectric properties of the single crystal material to adjust the acoustic properties of subsequent devices fabricated from this material. In a specific example, the method for forming the strained single crystal material can include modification of growth conditions of individual layers by employing one or a combination of the following parameters; gas phase reactant ratios, growth pressure, growth temperature, and introduction of impurities.

In an example, the single crystal material is grown epitaxially upon a substrate. Methods for growing the single crystal material can include metal-organic chemical vapor deposition (MOCVD), molecular beam epitaxy (MBE), hydride vapor phase epitaxy (HVPE), atomic layer deposition (ALD), or the like. Various process conditions can be selectively varied to change the piezoelectric properties of the single crystal material. These process conditions can include temperature, pressure, layer thickness, gas phase ratios, and the like. For example, the temperature conditions for films containing aluminum (Al) and gallium (Ga) and their alloys can range from about 800 to about 1500 degrees Celsius. The temperature conditions for films containing Al, Ga, and indium (In) and their alloys can range from about 600 to about 1000 degrees Celsius. In another example, the pressure conditions for films containing Al, Ga, and In and their alloys can range from about 1E-4 Torr to about 900 Torr.

Figure 11:
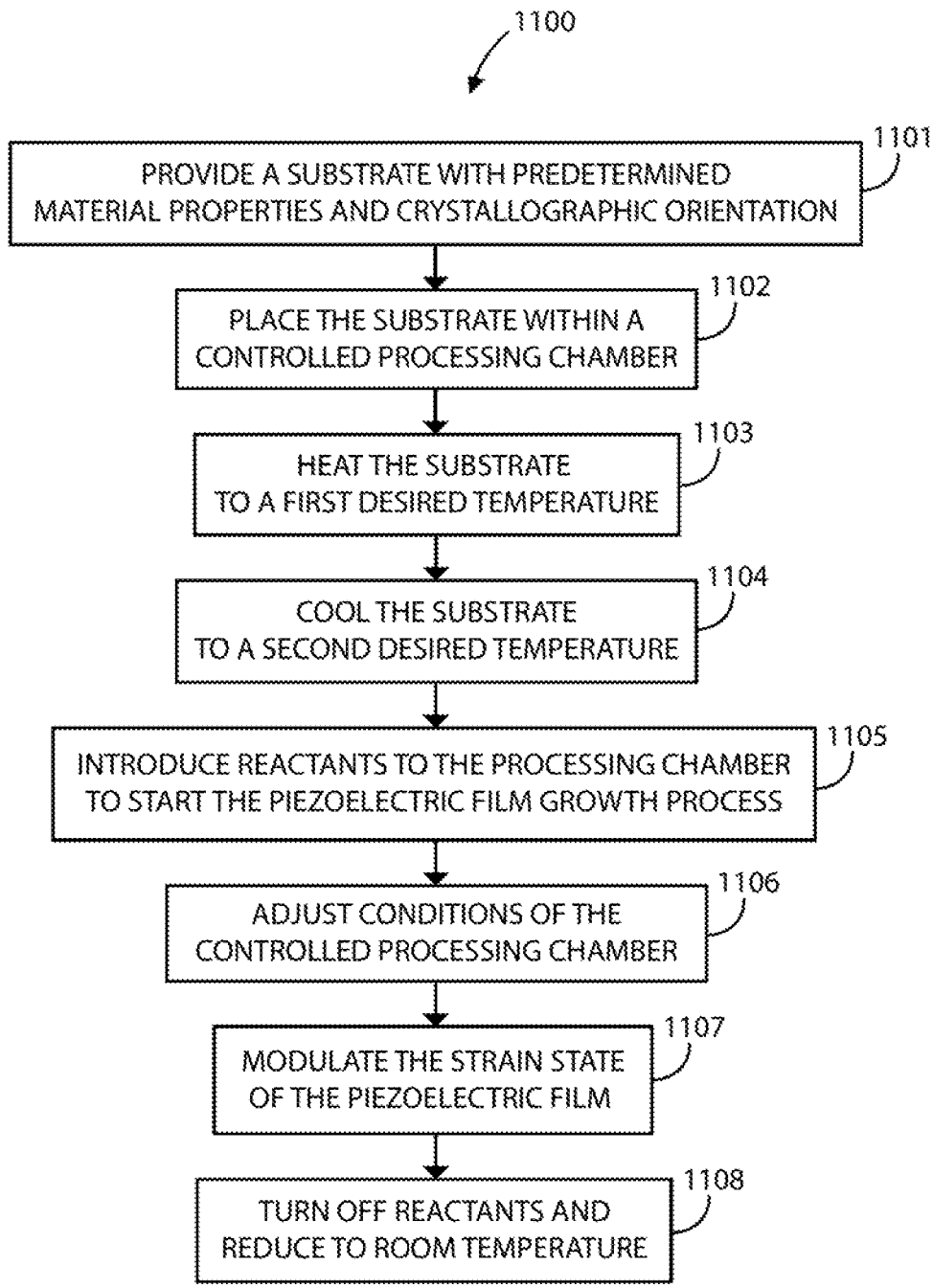
FIG. 11 is a flow diagram illustrating a method for manufacturing an acoustic resonator device according to an example of the present invention.

FIG. 11 is a flow diagram illustrating a method for manufacturing an acoustic resonator device according to an example of the present invention. The following steps are merely examples and should not unduly limit the scope of the claims herein. One of ordinary skill in the art would recognize many other variations, modifications, and alternatives. For example, various steps outlined below may be added, removed, modified, rearranged, repeated, and/or overlapped, as contemplated within the scope of the invention. A typical growth process 1100 can be outlined as follows:

- 1101. Provide a substrate having the required material properties and crystallographic orientation. Various substrates can be used in the present method for fabricating an acoustic resonator device such as Silicon, Sapphire, Silicon Carbide, Gallium Nitride (GaN) or Aluminum Nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Those of ordinary skill in the art will recognize other variations, modifications, and alternatives;
- 1102. Place the selected substrate into a processing chamber within a controlled environment;
- 1103. Heat the substrate to a first desired temperature. At a reduced pressure between 5-800 mbar the substrates are heated to a temperature in the range of 1100°-1400° C. in the presence of purified hydrogen gas as a means to clean the exposed surface of the substrate. The purified hydrogen flow shall be in the range of 5-30 slpm (standard liter per minute) and the purity of the gas should exceed 99.9995%;
- 1104. Cool the substrate to a second desired temperature. After 10-15 minutes at elevated temperature, the substrate surface temperature should be reduced by 100-200° C.; the temperature offset here is determined by the selection of substrate material and the initial layer to be grown (Highlighted in FIGS. 18A-C);
- 1105. Introduce reactants to the processing chamber. After the temperature has stabilized the Group III and Group V reactants are introduced to the processing chamber and growth is initiated.
- 1106. Upon completion of the nucleation layer the growth chamber pressures, temperatures, and gas phase mixtures may be further adjusted to grow the layer or plurality of layers of interest for the acoustic resonator device.
- 1107. During the film growth process the strain-state of the material may be modulated via the modification of growth conditions or by the controlled introduction of impurities into the film (as opposed to the modification of the electrical properties of the film).
- 1108. At the conclusion of the growth process the Group III reactants are turned off and the temperature resulting film or films are controllably lowered to room. The rate of thermal change is dependent upon the layer or plurality of layers grown and in the preferred embodiment is balanced such that the physical parameters of the substrate including films are suitable for subsequent processing.

Referring to step 1105, the growth of the single crystal material can be initiated on a substrate through one of several growth methods: direct growth upon a nucleation layer, growth upon a super lattice nucleation layer, and growth upon a graded transition nucleation layer. The growth of the single crystal material can be homoepitaxial, heteroepitaxial, or the like. In the homoepitaxial method, there is a minimal lattice mismatch between the substrate and the films such as the case for a native III-N single crystal substrate material. In the heteroepitaxial method, there is a variable lattice mismatch between substrate and film based on in-plane lattice parameters. As further described below, the combinations of layers in the nucleation layer can be used to engineer strain in the subsequently formed structure.

Referring to step 1106, various substrates can be used in the present method for fabricating an acoustic resonator device. Silicon substrates of various crystallographic orientations may be used. Additionally, the present method can use sapphire substrates, silicon carbide substrates, gallium nitride (GaN) bulk substrates, or aluminum nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Those of ordinary skill in the art will recognize other variations, modifications, and alternatives.

In an example, the present method involves controlling material characteristics of the nucleation and piezoelectric layer(s). In a specific example, these layers can include single crystal materials that are configured with defect densities of less than 1E+11 defects per square centimeter. The single crystal materials can include alloys selected from at least one of the following: AlN, AlGaN, GaN, InN, InGaN, AlInN, AlInGaN, ScAlN, ScAlGaN, ScN, BAlN, BAlScN, and BN. In various examples, any single or combination of the aforementioned materials can be used for the nucleation layer(s) and/or the piezoelectric layer(s) of the device structure.

According to an example, the present method involves strain engineering via growth parameter modification. More specifically, the method involves changing the piezoelectric properties of the epitaxial films in the piezoelectric layer via modification of the film growth conditions (these modifications can be measured and compared via the sound velocity of the piezoelectric films). These growth conditions can include nucleation conditions and piezoelectric layer conditions. The nucleation conditions can include temperature, thickness, growth rate, gas phase ratio (V/III), and the like. The piezo electric layer conditions can include transition conditions from the nucleation layer, growth temperature, layer thickness, growth rate, gas phase ratio (V/III), post growth annealing, and the like. Further details of the present method can be found below.

Figure 12:
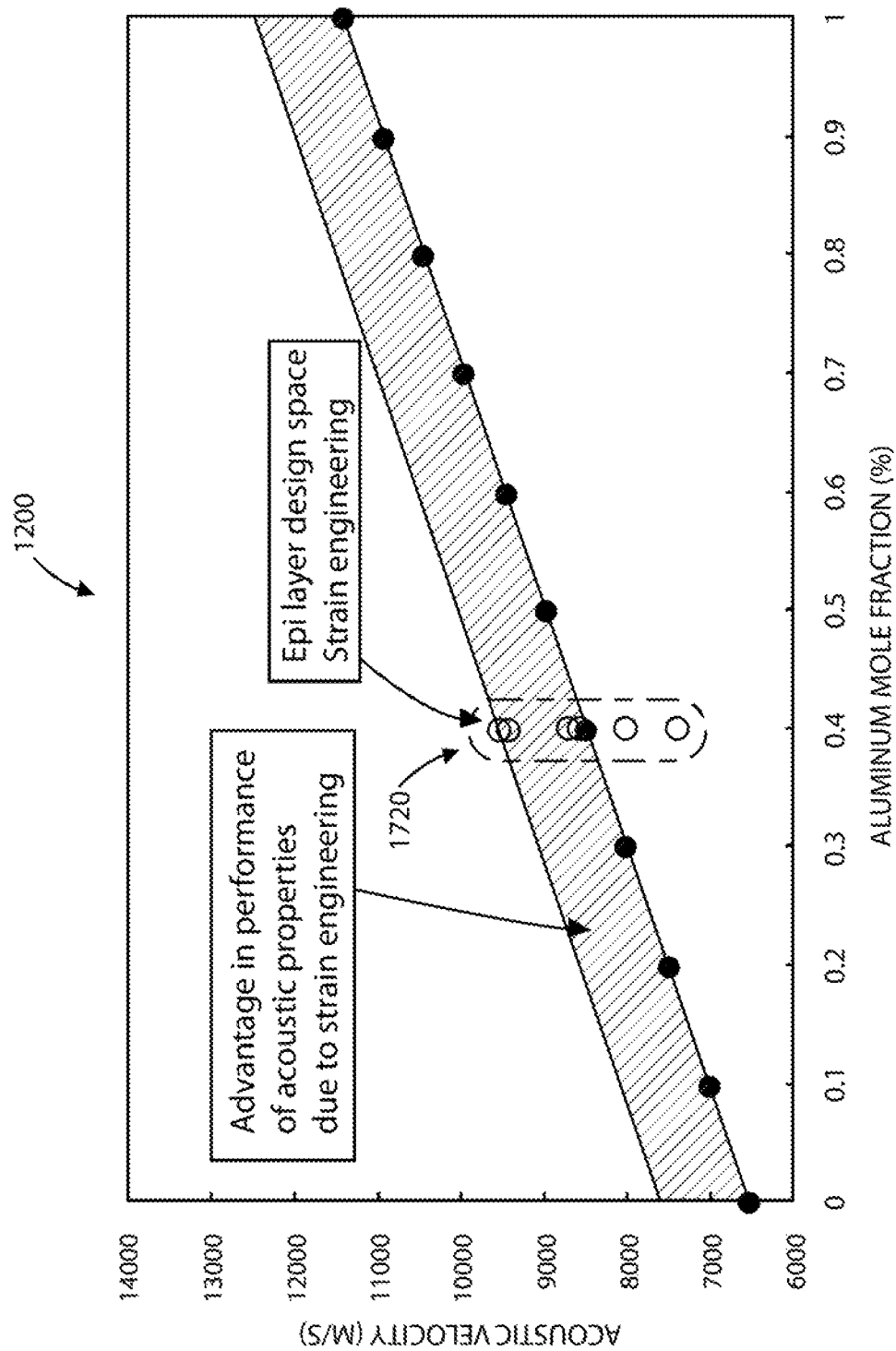
FIG. 12 is a simplified graph illustrating the results of forming a piezoelectric layer for an acoustic resonator device according to an example of the present invention.

FIG. 12 is a simplified graph illustrating the results of forming a piezoelectric layer for an acoustic resonator device according to an example of the present invention. This graph highlights the ability of to tailor the acoustic properties of the material for a given Aluminum mole fraction. Referring to step 1107 above, such flexibility allows for the resulting resonator properties to be tailored to the individual application. As shown, graph 1200 depicts a plot of acoustic velocity (m/s) over aluminum mole fraction (%). The marked region 1220 shows the modulation of acoustic velocity via strain engineering of the piezo electric layer at an aluminum mole fraction of 0.4. Here, the data shows that the change in acoustic velocity ranges from about 7,500 m/s to about 9,500 m/s, which is about ±1,000 m/s around the initial acoustic velocity of 8,500 m/s. Thus, the modification of the growth parameters provides a large tunable range for acoustic velocity of the acoustic resonator device. This tunable range will be present for all aluminum mole fractions from 0 to 1.0 and is a degree of freedom not present in other conventional embodiments of this technology.

The present method also includes strain engineering by impurity introduction, or doping, to impact the rate at which a sound wave will propagate through the material. Referring to step 1107 above, impurities can be specifically introduced to enhance the rate at which a sound wave will propagate through the material. In an example, the impurity species can include, but is not limited to, the following: silicon (Si), magnesium (Mg), carbon (C), oxygen (O), erbium (Er), rubidium (Rb), strontium (Sr), scandium (Sc), beryllium (Be), molybdenum (Mo), zirconium (Zr), Hafnium (Hf), and vanadium (Va). Silicon, magnesium, carbon, and oxygen are common impurities used in the growth process, the concentrations of which can be varied for different piezoelectric properties. In a specific example, the impurity concentration ranges from about 1E+10 to about 1E+21 per cubic centimeter. The impurity source used to deliver the impurities to can be a source gas, which can be delivered directly, after being derived from an organometallic source, or through other like processes.

The present method also includes strain engineering by the introduction of alloying elements, to impact the rate at which a sound wave will propagate through the material. Referring to step 1107 above, alloying elements can be specifically introduced to enhance the rate at which a sound wave will propagate through the material. In an example, the alloying elements can include, but are not limited to, the following: magnesium (Mg), erbium (Er), rubidium (Rb), strontium (Sr), scandium (Sc), titanium (Ti), zirconium (Zr), hafnium (Hf), vanadium (Va), niobium (Nb), and tantalum (Ta). In a specific embodiment, the alloying element (ternary alloys) or elements (in the case of quaternary alloys) concentration ranges from about 0.01% to about 50%. Similar to the above, the alloy source used to deliver the alloying elements can be a source gas, which can be delivered directly, after being derived from an organometallic source, or through other like processes. Those of ordinary skill in the art will recognize other variations, modifications, and alternatives to these processes.

The methods for introducing impurities can be during film growth (in-situ) or post growth (ex-situ). During film growth, the methods for impurity introduction can include bulk doping, delta doping, co-doping, and the like. For bulk doping, a flow process can be used to create a uniform dopant incorporation. For delta doping, flow processes can be intentionally manipulated for localized areas of higher dopant incorporation. For co-doping, the any doping methods can be used to simultaneously introduce more than one dopant species during the film growth process. Following film growth, the methods for impurity introduction can include ion implantation, chemical treatment, surface modification, diffusion, co-doping, or the like. Those of ordinary skill in the art will recognize other variations, modifications, and alternatives.

Figure 13A:
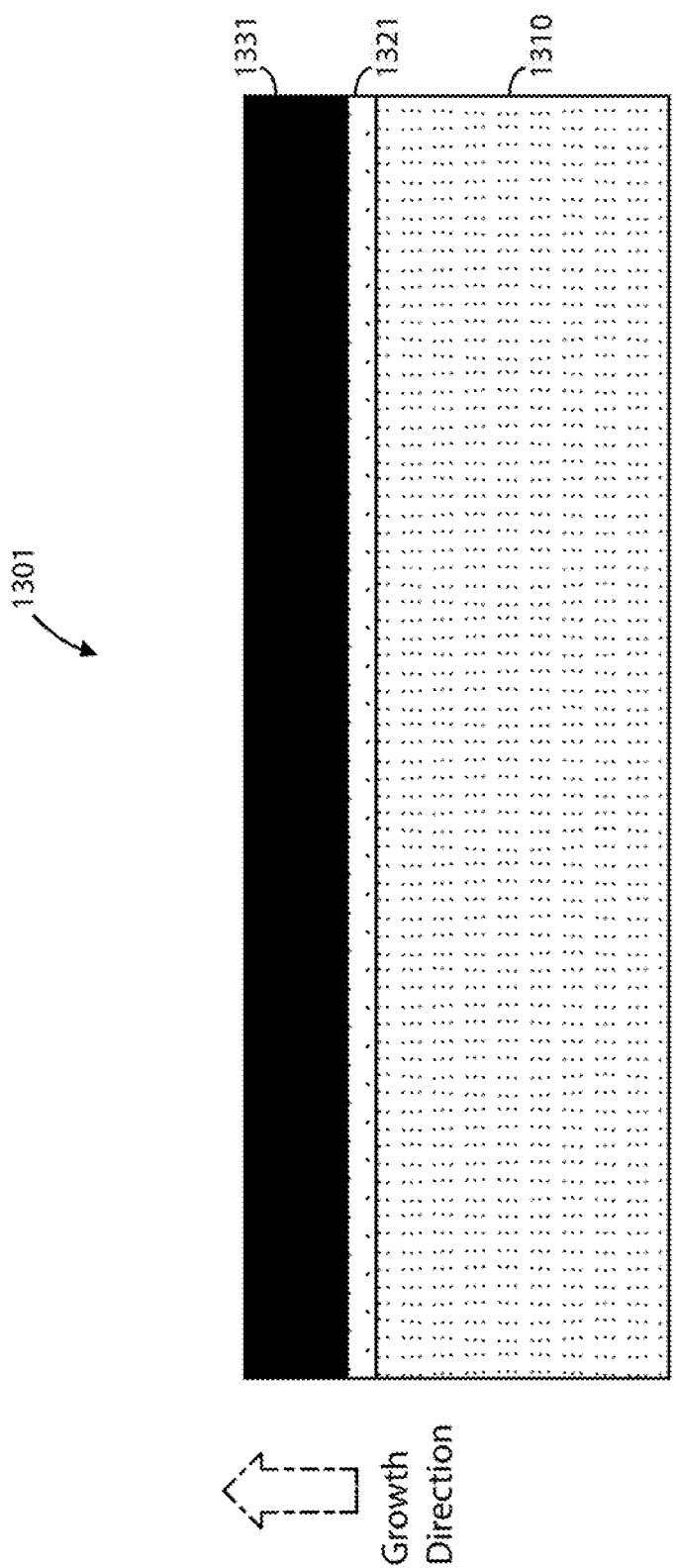
FIGS. 13A-C are simplified diagrams illustrating methods for forming a piezoelectric layer for an acoustic resonator device according to various examples of the present invention.

FIG. 13A is a simplified diagram illustrating a method for forming a piezoelectric layer for an acoustic resonator device according to an example of the present invention. As shown in device 1301, the piezoelectric layer 1331, or film, is directly grown on the nucleation layer 1321, which is formed overlying a surface region of a substrate 1310. The nucleation layer 1321 may be the same or different atomic composition as the piezoelectric layer 1331. Here, the piezoelectric film 1331 may be doped by one or more species during the growth (in-situ) or post-growth (ex-situ) as described previously.

Figure 13B:
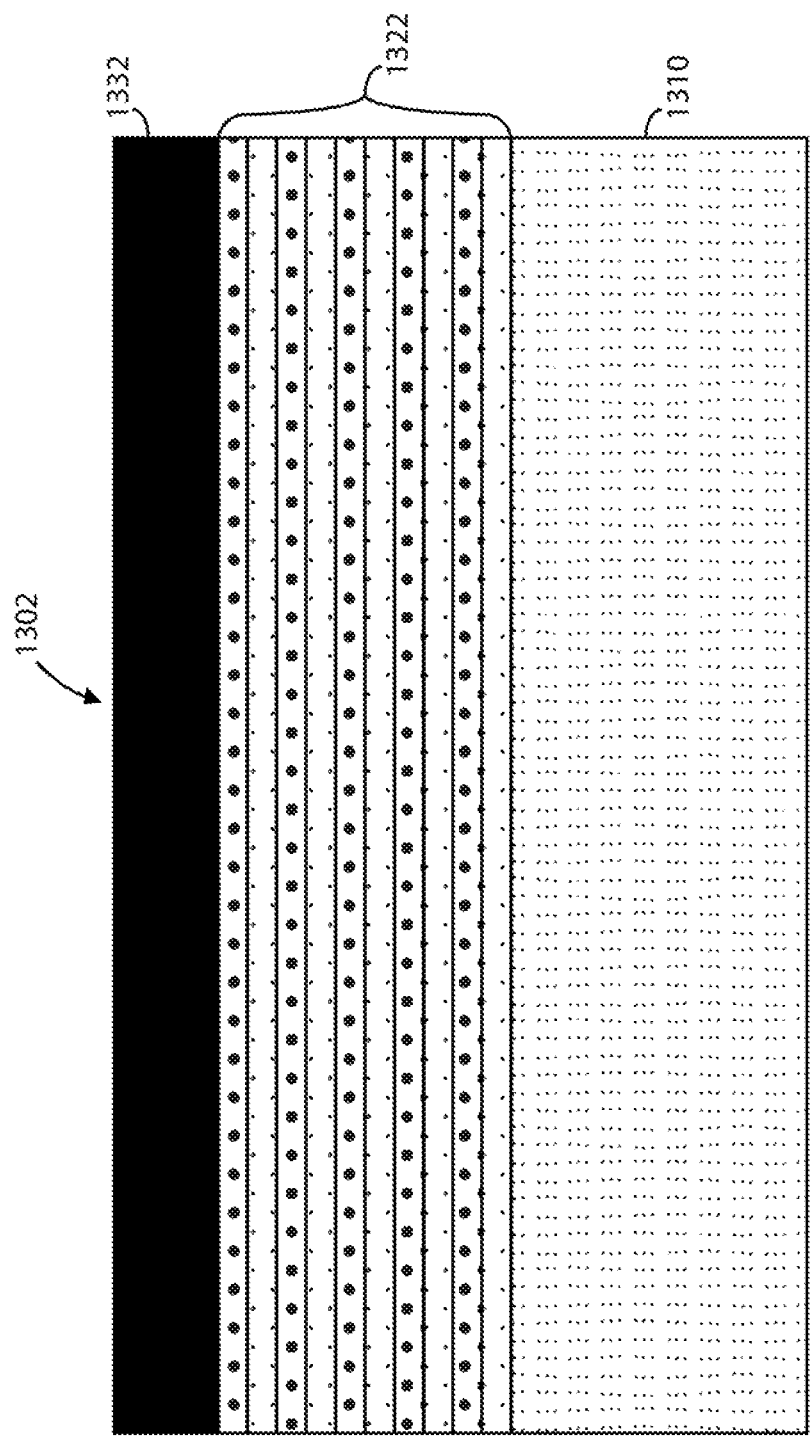

FIG. 13B is a simplified diagram illustrating a method for forming a piezoelectric layer for an acoustic resonator device according to an example of the present invention. As shown in device 1302, the piezoelectric layer 1332, or film, is grown on a super lattice nucleation layer 1322, which is comprised of layer with alternating composition and thickness. This super lattice layer 1322 is formed overlying a surface region of the substrate 1310. The strain of device 1302 can be tailored by the number of periods, or alternating pairs, in the super lattice layer 1322 or by changing the atomic composition of the constituent layers. Similarly, the piezoelectric film 1332 may be doped by one or more species during the growth (in-situ) or post-growth (ex-situ) as described previously.

Figure 13C:
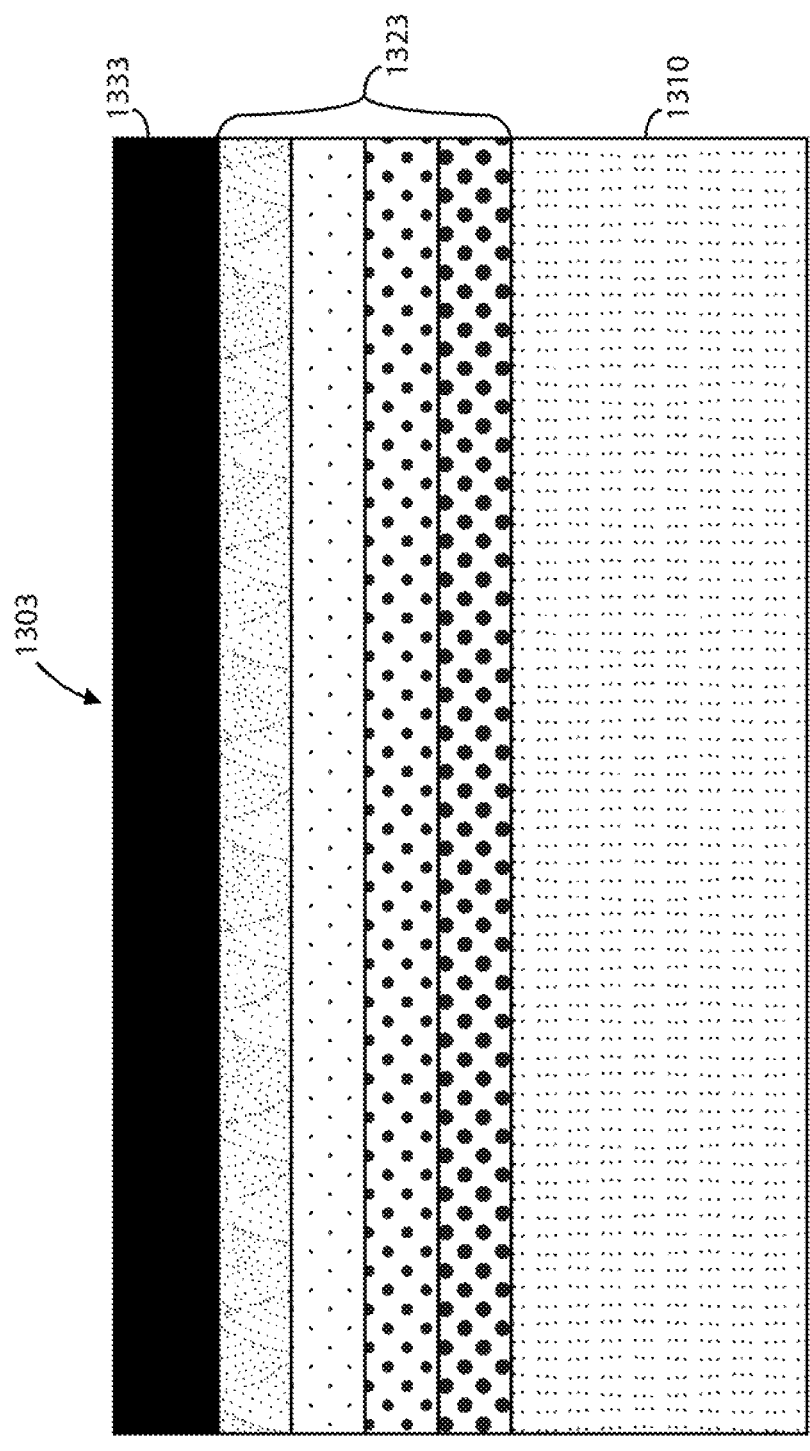

FIG. 13C is a simplified diagram illustrating a method for forming a piezoelectric layer for an acoustic resonator device according to an example of the present invention. As shown in device 1303, the piezoelectric layer 1333, or film, is grown on graded transition layers 1323. These transition layers 1323, which are formed overlying a surface region of the substrate 1310, can be used to tailor the strain of device 1303. In an example, the alloy (binary or ternary) content can be decreased as a function of growth in the growth direction. This function may be linear, step-wise, or continuous. Similarly, the piezoelectric film 1333 may be doped by one or more species during the growth (in-situ) or post-growth (ex-situ) as described previously.

In an example, the present invention provides a method for manufacturing an acoustic resonator device. As described previously, the method can include a piezoelectric film growth process such as a direct growth upon a nucleation layer, growth upon a super lattice nucleation layer, or a growth upon graded transition nucleation layers. Each process can use nucleation layers that include, but are not limited to, materials or alloys having at least one of the following: AlN, AlGaN, GaN, InN, InGaN, AlInN, AlInGaN, ScAlN, ScAlGaN, ScN, BAlN, BAlScN, and BN. Those of ordinary skill in the art will recognize other variations, modifications, and alternatives.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process. Such filters or resonators can be implemented in an RF filter device, an RF filter system, or the like. Depending upon the embodiment, one or more of these benefits may be achieved. Of course, there can be other variations, modifications, and alternatives.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A method of fabricating an array of acoustic resonators comprising the steps of:
   selecting a first target frequency response and a first target effective coupling coefficient for operation of a first single crystal film bulk acoustic resonator (FBAR) filter of the array of acoustic resonators;
   selecting a second target frequency response and a second target effective coupling coefficient for operation of a second single crystal FBAR filter of the array of acoustic resonators, said first target effective coupling coefficient being degraded relative to said second target effective coupling coefficient;
   determining thicknesses and materials of single crystal piezoelectric and electrode layers for forming said first and second single crystal FBAR filters so as to achieve said first and second target frequency responses and said first and second target effective coupling coefficients, including selecting an increased electrode layer thickness for at least one electrode layer of said first single crystal FBAR filter, said increased electrode layer thickness being greater than electrode layer thicknesses selected for said second single crystal FBAR filter such that said degraded first target effective coupling coefficient is achieved; and
   forming said first and second single crystal FBAR filters based on said thicknesses and materials;
   wherein forming said first and second single crystal FBAR filters based on said thicknesses and materials includes forming said single crystal piezoelectric layers as strained single crystal piezoelectric layers of said thicknesses and materials by an epitaxial growth process configured by nucleation growth parameters and piezoelectric layer parameters to modulate a strain condition in each of the strained single crystal piezoelectric layers to improve one or more piezoelectric properties of said strained single crystal piezoelectric layer.

2. The method of claim 1 wherein said step of determining said thicknesses and materials includes determining a ratio of a thickness of the single crystal piezoelectric layer to a total thickness of electrode layers for each of said first and second single crystal FBAR filters, said ratio for said first single crystal FBAR filter being less than said ratio for said second single crystal FBAR filter.

3. The method of claim 1 wherein said step of selecting said first target coefficient includes selecting a value in the range of 2.5 percent to 4.0 percent and said step of selecting said second target coefficient includes selecting a value in the range of 4.0 percent to 6.0 percent; and wherein said step of selecting said first and second target coefficients includes selecting the values such that the value of the first target coefficient is less than the value of the second target coefficient.

4. The method of claim 1 further comprising the step of forming a duplexer to include each of: said first single crystal FBAR filter as a transmit filter; and said second single crystal FBAR filter as a receive filter.

5. The method of claim 1 wherein said step of forming said first and second single crystal FBAR filters includes depositing AlN as said single crystal piezoelectric layer and depositing Mo as said electrode layers, said electrode layers of said first single crystal FBAR filter having a thickness that is in the range of 1.2 to 2.8 times the thickness of electrode layers of said second single crystal FBAR filter.

6. The method of claim 1 wherein said selecting steps and said step of forming said first and second single crystal FBAR filters includes providing the first target frequency response having a center frequency that is within 100 MHz of a center frequency of said second target frequency response.

7. The method of claim 1 wherein forming said first and second single crystal FBAR filters includes forming said strained single crystal piezoelectric layers of said thicknesses and materials overlying a nucleation layer characterized by the nucleation growth parameters, the nucleation layer being formed overlying a substrate selected from one of the following: a silicon substrate, a sapphire substrate, silicon carbide substrate, a GaN bulk substrate, a GaN template, an AlN bulk, an AlN template, an $Al_xGa_{1-x}N$ template, and an silicon on insulator (SOI) wafer.

8. The method of claim 7 wherein the epitaxial growth process is selected from one of the following: metal-organic chemical vapor deposition (MOCVD), molecular beam epitaxy (MBE), hydride vapor phase epitaxy (HVPE), and atomic layer deposition (ALD); and wherein the nucleation layer and the strained single crystal piezoelectric layers include materials or alloys having at least one of the following: AlN, AlGaN, GaN, InN, InGaN, AlInN, AlInGaN, ScAlN, ScAlGaN, ScN, BAlN, BAlScN, and BN.

9. The method of claim 1 wherein the nucleation growth parameters include temperature, pressure, thickness, growth rate, and gas phase ratio of reactant species.

10. The method of claim 1 wherein the piezoelectric parameters include nucleation layer formation and transition conditions, growth temperatures, growth pressure, layer thickness, growth rate, and gas phase ratio.

11. A duplexer comprising:
    a transmit single crystal film bulk acoustic resonator (FBAR) array having transmit series single crystal FBARs connected in series and having transmit shunt single crystal FBARS; and
    a receive single crystal FBAR array having receive series single crystal FBARs connected in series and having receive shunt single crystal FBARs;
    wherein said transmit single crystal FBAR array has an effective coupling coefficient that is less than an effective coupling coefficient of said receive single crystal FBAR array, said less effective coupling coefficient being realized by providing at least some single crystal FBARs of said transmit single crystal FBAR array with thicker electrode layers and thinner piezoelectric layers than said single crystal FBARs of said receive single crystal FBAR array, said at least some single crystal FBARs of said transmit single crystal FBAR array each having a ratio of thickness of said single crystal piezoelectric layer to total thickness of said electrode layers, with said ratio being less than ratios of piezoelectric layer thickness to total electrode layer thickness for said receive series single crystal FBARs and said receive shunt single crystal FBARs;
wherein each said transmit shunt single crystal FBARs include a first strained piezoelectric layer configured by first nucleation growth parameters and first piezoelectric layer parameters to modulate a first strain condition to improve one or more piezoelectric properties of said first strained piezoelectric layer; and
wherein each said receive shunt single crystal FBARs include a second strained piezoelectric layer configured by second nucleation growth parameters and second piezoelectric layer parameters to modulate a second strain condition to improve one or more piezoelectric properties of said second strained piezoelectric layer.

12. The duplexer of claim 11 wherein said transmit and receive single crystal FBAR arrays have frequencies compatible with operation in a code division multiple access (CDMA) personal communication system (PCS).

13. The duplexer of claim 11 wherein said total thickness of said electrode layers of said at least some single crystal FBARs is in the range of 1.2 to 2.8 times said total electrode layer thickness for said receive series single crystal FBARs and said receive shunt single crystal FBARs.

14. The duplexer of claim 11 wherein the first strained single crystal piezoelectric layer is coupled overlying a first nucleation layer characterized by the first nucleation growth parameters, the first nucleation layer being coupled overlying a first substrate;
wherein the second strained single crystal piezoelectric layer is coupled overlying a second nucleation layer characterized by the second nucleation growth parameters, the second nucleation layer being coupled overlying a second substrate;
wherein the first and second substrates are each selected from one of the following: a silicon substrate, a sapphire substrate, silicon carbide substrate, a GaN bulk substrate, a GaN template, an AlN bulk, an AlN template, an AlxGa1-xN template, and an silicon on insulator (SOI) wafer.

15. The duplexer of claim 14 wherein the first and second nucleation layers and the first and second strained single crystal piezoelectric layers each include materials or alloys having at least one of the following: AlN, AlGaN, GaN, InN, InGaN, AlInN, AlInGaN, ScAlN, ScAlGaN, ScN, BAlN, BAlScN, and BN.

16. The duplexer of claim 11 wherein the first and second nucleation growth parameters include temperature, pressure, thickness, growth rate, and gas phase ratio of reactant species.

17. The duplexer of claim 11 wherein the first and second piezoelectric parameters include nucleation layer formation and transition conditions, growth temperatures, growth pressure, layer thickness, growth rate, and gas phase ratio.

18. A duplexer comprising:
a transmit single crystal film bulk acoustic resonator (FBAR) array having transmit series single crystal FBARs connected in series and having transmit shunt single crystal FBARs; and
a receive single crystal FBAR array having receive series single crystal FBARs connected in series and having receive shunt single crystal FBARs;
wherein said transmit single crystal FBAR array has an effective coupling coefficient that is less than an effective coupling coefficient of said receive single crystal FBAR array, at least some single crystal FBARs of said transmit single crystal FBAR array having thicker electrode layers and thinner single crystal piezoelectric layers than said single crystal FBARs of said receive single crystal FBAR array in order to attain said less effective coupling coefficient that is exhibited by said transmit single crystal FBAR array;
wherein each said transmit shunt single crystal FBARs include a first strained piezoelectric layer configured by first nucleation growth parameters and first piezoelectric layer parameters to modulate a first strain condition to improve one or more piezoelectric properties of said first strained piezoelectric layer; and
wherein each said receive shunt single crystal FBARs include a second strained piezoelectric layer configured by second nucleation growth parameters and second piezoelectric layer parameters to modulate a second strain condition to improve one or more piezoelectric properties of said second strained piezoelectric layer.

19. The duplexer of claim 18 wherein the first strained single crystal piezoelectric layer is coupled overlying a first nucleation layer characterized by the first nucleation growth parameters, the first nucleation layer being coupled overlying a first substrate;
wherein the second strained single crystal piezoelectric layer is coupled overlying a second nucleation layer characterized by the second nucleation growth parameters, the second nucleation layer being coupled overlying a second substrate;
wherein the first and second substrates are each selected from one of the following: a silicon substrate, a sapphire substrate, silicon carbide substrate, a GaN bulk substrate, a GaN template, an AlN bulk, an AlN template, and an AlxGa1-xN template.

20. The duplexer of claim 18 wherein the first and second nucleation growth parameters include temperature, pressure, thickness, growth rate, and gas phase ratio of reactant species; and wherein the first and second piezoelectric parameters include nucleation layer formation and transition conditions, growth temperatures, growth pressure, layer thickness, growth rate, and gas phase ratio.

* * * * *